United States Patent [19]

Ohuchi et al.

[11] 4,083,062
[45] Apr. 4, 1978

[54] AVALANCHE PHOTODIODE WITH REDUCED AVALANCHE BREAKDOWN VOLTAGE

[75] Inventors: Hirobumi Ohuchi; Sumio Kawakami; Masahiro Okamura, all of Ibaraki, Japan

[73] Assignee: Hitachi, Ltd., Japan

[21] Appl. No.: 766,724

[22] Filed: Feb. 8, 1977

[30] Foreign Application Priority Data

Feb. 21, 1976 Japan .................................. 51-18310

[51] Int. Cl.² ............................................ H01L 29/90
[52] U.S. Cl. ...................................... 357/13; 357/30; 357/89; 357/90
[58] Field of Search .................... 357/13, 30, 89, 90

[56] References Cited

U.S. PATENT DOCUMENTS

| 3,621,466 | 11/1971 | Misawa | 331/107 R |
| 3,668,555 | 6/1972 | Kasperkovitz | 331/107 R |
| 3,814,997 | 6/1974 | Takahashi | 357/58 |
| 3,886,579 | 5/1975 | Ohuchi | 357/13 |
| 3,921,092 | 11/1975 | Goronkin | 357/13 |
| 3,992,715 | 11/1976 | Delagebeaudeuf | 357/13 |

*Primary Examiner*—Martin H. Edlow
*Attorney, Agent, or Firm*—Craig & Antonelli

[57] ABSTRACT

An avalanche photodiode has a rectification barrier formed by an $n^+$-layer and a p-type layer of a low doping concentration. A thin p-layer having a higher doping concentration than a $p^-$-layer is inserted between the $p^-$-layer and a $\pi$-layer, whereby the avalanche breakdown voltage of the photodiode is lowered considerably.

21 Claims, 5 Drawing Figures

AVALANCHE PHOTODIODE WITH REDUCED AVALANCHE BREAKDOWN VOLTAGE

BACKGROUND OF THE INVENTION

The present invention relates to an avalanche photodiode for use in a device for converting a light signal into an electric signal, and more particularly to an avalanche photodiode with a considerably reduced avalanche breakdown voltage, without reducing other performance characteristics.

Detection of a light signal by the use of a rectification barrier or a p-n junction which is biased in the reverse direction has been well known in the art, and a semiconductor device for this purpose is called an avalanche photodiode (hereinafter represented as APD for simplicity). Since an APD utilizes the avalanche phenomenon and hence it has a self-amplification function, it is suitable for use in a detecting device for a light signal. Accordingly, the APD is considered most suitable as a light detecting device in optical communication systems.

In an optical communication system which utilizes semiconductor lasers and APDs, a low operation voltage is an important feature and an advantage. If a high voltage source is necessary to drive the APDs, the feature or advantage of the system will be lost. Further, electrical supply of high voltages to repeaters in order to drive APDs will bring about difficult problems in designing the system. From these reasons, it is desirable that the operation voltage for APDs be nearly the same as the driving voltage for integrated circuits, or otherwise be about 200 volts or less in considering the operating voltages and of electronic parts other than APDs.

SUMMARY OF THE INVENTION

Accordingly, one of the objects of the present invention is to provide an avalanche photodiode with a substantially reduced avalanche breakdown voltage, without sacrificing the light-current conversion efficiency and increasing the noise level and response time.

According to the present invention there is provided an avalanche photodiode having an intermediate layer adjoining an avalanche multiplication layer which is adjacent to a layer of a conductivity type opposite to that of the avalanche multiplication layer. The intermediate layer has the same conductivity type as that of the avalanche multiplication layer and has a higher doping concentration relative to that of the avalanche multiplication layer. Further, the intermediate layer is interposed between a layer of the same conductivity type and of a very low doping concentration and the avalanche multiplication layer. The avalanche photodiode of the present invention is characterized by the fact that it has a low avalanche breakdown voltage without sacrificing noise level, light-current conversion efficiency, and response speed.

According to one aspect of the present invention there is provided an avalanche photodiode which comprises a semiconductor body comprising a first layer of one conductivity type, a second layer of the opposite conductivity type, adjoining the first layer, forming a rectification barrier with the first layer, the barrier being biased in the reverse direction, while a predetermined voltage is applied thereto, a third layer of the opposite conductivity type, adjoining the second layer, having a higher doping concentration than the second layer, a fourth layer of the opposite conductivity type, adjoining the third layer, having a lower doping concentration than the second layer, and a fifth layer of the opposite conductivity type, adjoining the fourth layer, having a higher doping concentration than the third layer, a first electrode in ohmic contact with the first layer, a second electrode in ohmic contact with the first layer, and a film, which covers a light receiving surface defined in the surface of one of the first and fifth layers, for preventing reflection of a light signal impinging upon the light receiving surface.

Other objects and features of the present invention will be apparent from the following detailed description, taken in conjunction with the accompanying drawings.

DETAILED DESCRIPTION OF THE PRIOR ART

Figure 1:
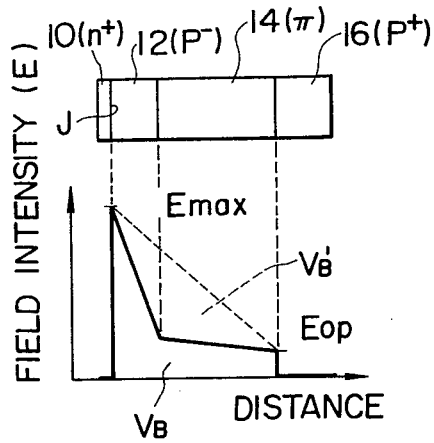
FIG. 1 is a schematic view of a construction of a conventional avalanche photodiode showing the electric field intensity distribution.

U.S. Pat. No. 3,886,579, entitled "Avalanche Photodiode", assigned to the assignee of this application, discloses an avalanche photodiode of the hyperabrupt junction type which has $p^+ n \nu n^+$ or $n^+ p \pi p^+$ structure. The avalanche photodiode has a reduced breakdown voltage without causing any degradation in the response to incident light and a stable avalanche breakdown characteristic can be obtained when combined with a guard ring. Relationships between the maximum field intensity at a rectification barrier or a p-n junction of the avalanche photodiode and its structure may be illustrated in FIG. 1. The semiconductor body consists of a first $n^+$-layer 10 of n-type conductivity, a second $p^-$-layer 12 of a p type conductivity with which the first layer forms the rectification barrier (J), a third $\pi$-layer 14 of a p-type conductivity, and a fourth $p^+$-layer of a p type conductivity. A first electrode (not shown) is in ohmic contact with the first layer and a second electrode (not shown) is in ohmic contact with the fourth layer.

By inserting the $\pi$-layer which has a very low doping concentration, such as $10^{14}$ cm$^{-3}$ or less, between the $p^-$-layer having a higher doping concentration than the $\pi$ layer and the $p^+$-layer 16 to which the second electrode is connected, the avalanche breakdown voltage ($V_B$), which is an integration of an area defined by the solid line, is decreased as compared with an avalanche breakdown voltage ($V_B'$) of an avalanche photodiode without the π-layer having the same depletion width as the total width of the p and π-layers.

According to the inventors' experiments on the avalanche photodiode disclosed in the aforementioned U.S. patent, it has been found that when the operational field intensity ($E_{OP}$) is $1 \times 10^4$ V/cm in order to drift photogenerated carriers at saturated speed, to thereby achieve a response speed, the avalanche breakdown voltage $V_B$ was about 130 volts (in this case, the impurity concentration of the p⁻-layer was $5 \times 10^{15}$ cm⁻³) while the breakdown voltage $V_B$ was about 400 volts. The present inventors made an attempt to further lower the breakdown voltage of the hyperabrupt avalanche photodiode.

DETAILED DESCRIPTION OF THE INVENTION

Figure 2:
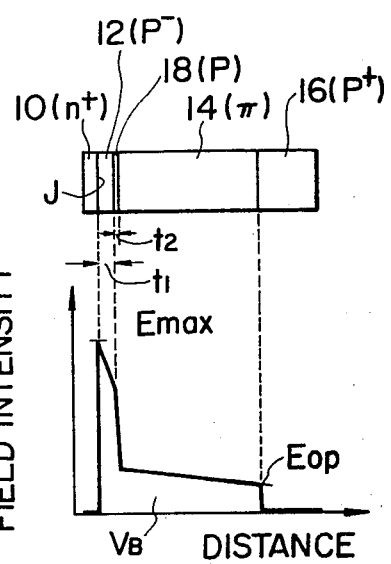
FIG. 2 is a schematic view of a construction of an avalanche photodiode of the present invention showing the distribution of the electric field intensity (E) in relation to distance from the rectification barrier.

According to the present invention, a thin intermediate p-layer 18 of a p type conductivity is inserted between the p⁻-layer and π-layer as shown in FIG. 2, whereby the avalanche breakdown voltage $V_B$, expressed as an integration of the area defined by the solid line, is lowered remarkably. The doping concentration of the p-layer (intermediate layer) is higher than that of the p⁻-layer. Since, in this structure, the avalanche multiplication is concentrated substantially in the p⁻-region, the p⁻-layer should have as narrow a width as possible, so that the n⁺-p⁻ junction may have as low maximum field as possible for the impurity concentrations of the layers. The doping concentration of the p⁻-layer should be higher than that of the π-layer. The π-layer should have the lowest doping concentration to avoid an increase of the applied voltage across the π-layer. According to the inventors' experiments, it was found that the doping concentration of the π-layer should be less than $10^{14}$ cm⁻³.

On the other hand, it was also found that the doping concentration of the p⁻-layer should be lower than about $10^{16}$ cm⁻³ and that the doping concentration of the p-layer should be within a range of $10^{16}$ to $10^{19}$ cm⁻³, and that the doping concentration of the p-layer should be higher than that of the p⁻-layer.

The thickness of the p⁻-layer is one of the important factors for the avalanche photodiode of the present invention. When the thickness is too narrow, it will lead to larger excess noise. The excess noise increases because, at the high fields multiplication region, the ionization coefficients for holes are not much lower than the ionization coefficients for electrons. On the other hand, if the thickness is too large, the avalanche breakdown voltage of the avalanche photodiode becomes high. According to the present invention, the distance ($t_1$) between the rectification barrier or p-n junction and the p-layer should be such that the ionization constant of the minority carriers in the p⁻-layer becomes one fifth to one tenth the maximum ionization constant at the barrier or the junction. The maximum ionization constant can be easily determined by any person skilled in the art when the doping concentrations of the p⁻-layer and p-layer are given. The thickness ($t_2$) of the p-layer can be another important factor of the photodiode of the present invention. When the doping concentration of the p-layer is within a range of $10^{16}$ to $10^{19}$ cm⁻³, the thickness is, preferably, 0.1 to 2 μm.

Figure 3:
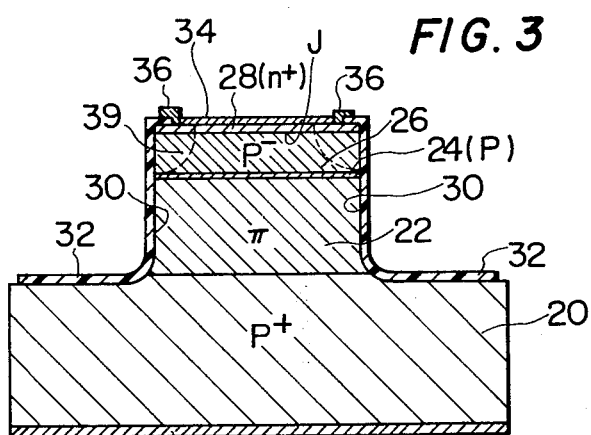
FIG. 3 is a sectional view of an avalanche photodiode of the present invention.

FIG. 3 shows a sectional view of an avalanche photodiode according to the present invention wherein the first n⁺-layer 28 forms a rectification barrier or p-n junction (J) with the second p⁻-layer 26. The third p-layer or the intermediate layer 24 is disposed between the second layer 26 and the fourth π-layer 22. A p⁺-layer 20 adjoins the π-layer. The surface of the n⁺-layer serves as a light-receiving surface upon which a light signal impinges. Preferably, the π, p and p⁻-layers are successively formed by the use of an epitaxial growth method which is well known in the art. The n⁺-layer is formed by diffusing a dopant into the p⁻-layer. The light-receiving surface is covered with a film 34 such as a silicon dioxide film, to prevent light reflection on the surface. In order to attenuate the field intensity on the surface of the semiconductor body, a so-called mesa structure was employed in a manner that the body was subjected to etching to form a portion with a reduced section area. The exposed surface of the portion is covered with an insulating film 32 such as a silicon dioxide film to passivate the surface of the junction. The films may be formed by the use of, such as, a chemical vapor deposition method, which is also well known in the art as a method of forming an insulating film on the surface of a semiconductor body.

A first electrode 36 is in ohmic contact with a part of the surface of the n⁺-layer through windows formed in the film 34. A second electrode 18 is in ohmic contact with the surface of the p⁺-layer.

The thickness of the p⁺-layer 20, which serves as a substrate, should be about 150 to 200 μm from the view point of handling thereof, and the specific resistivity thereof should be about 0.01 Ω-cm or less so as to obtain a small series resistance and to make ohmic contact with the second electrode.

In this example, the π-layer of the p type conductivity having a doping concentration of $1 \times 10^{14}$ cm⁻³ and thickness of 13μm was formed by an epitaxial growth method on the p⁺-layer. Then the p-layer having a doping concentration of $1 \times 10^{16}$ cm⁻³ and a thickness of 1μm was superposed by an epitaxial growth method on the π-layer. On the p-layer there was formed by an epitaxial growth method, the p⁻-layer having a doping concentration of $1 \times 10^{15}$ cm⁻³ and a thickness of 7.5μm. Finally, the n⁺-layer with a doping concentration of $1 \times 10^{19}$ cm⁻³ and a thickness of 1μm was formed to thereby form a rectification barrier therebetween. Therefore, the thickness of the p⁻-layer become about 6.5 μm, which corresponds to the distance wherein the ionization constant α for silicon is about one tenth the maximum ionization constant.

After the semiconductor body having a predetermined junction configuration was formed, the epitaxially grown layers (n⁺, p⁻, p and π-layers) were subjected to a known selective etching method to obtain a desired mesa structure having a light responsive portion. The depth of etching is such that the p⁺-substrate is exposed. The exposed surface of the portion with the reduced section area was covered with a silicon dioxide film of 0.8μm formed by a chemical vapor deposition method. It is preferable to anneal the semiconductor body having the silicon dioxide films in an inert gas atmosphere such as in an argon gas atmosphere to stabilize the photodiode. Then windows were formed by etching in the silicon dioxide film on the surface of the n⁺-layer. The first electrode was formed through the windows by the use of photoetching and vacuum evaporation techniques. The second electrode was then formed on the surface of the p⁺-layer. The barrier is biased in the reverse direction by application of a predetermined voltage to the barrier whereby the avalanche breakdown occurs in response to a light signal. The operational field intensity ($E_{op}$) was designed to be $1 \times 10^4$ V/cm, which is the field intensity high enough that photogenerated, multiplicated carriers move through the depletion layer at the saturated speed. The avalanche photodiode mentioned above was found to have an avalanche breakdown voltage as low as above 180 volts, which is much lower than 320 volts of the avalanche photodiode disclosed in U.S. Pat. No. 3,886,579. Further, it was found that this photodiode has a high quantum efficiency (or light-current conversion efficiency) of 68% and a small excess noise index, $x$, of 0.32 ($M^x$), depsite its low breakdown voltage. In the case where the impurity concentration of the p$^-$-layer is $5 \times 10^{15}$ cm$^{-3}$, the avalanche photodiode of the present invention has an avalanche breakdown voltage of about 90 volts, while the avalanche photodiode disclosed in U.S. Pat. No. 3,886,579 has a breakdown voltage of about 130 volts. In general, the lowering of the breakdown voltage results in a decrease in the light-current conversion efficiency and an increase in the noise level. However, it is noteworthy that the avalanche photodiode of the present invention has a high light-current conversion efficiency and small noise level, although it has a remarkably reduced breakdown voltage.

Figure 4:
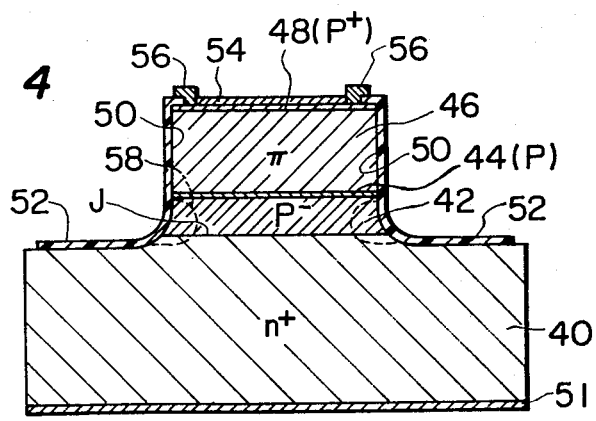
FIG. 4 is a sectional view of an avalanche photodiode according to another embodiment of the present invention.

FIG. 4 shows another embodiment of the present invention wherein epitaxially grown layers 42, 44 and 46 were formed on n$^+$-substrate 40. A rectification barrier (J) is, accordingly, formed by the p$^-$-layer and the n$^+$-layer. The p$^+$-layer 48 was formed by diffusing acceptor impurities into the $\pi$-layer, which was formed by an epitaxial growth method. The thickness of the p$^+$-layer, $\pi$-layer, p-layer and p$^-$-layer were, respectively, 1$\mu$m, 13$\mu$m, 1$\mu$m and 6.5 $\mu$m. Exposed surfaces of the portion with a reduced section area were covered with a silicon dioxide film 54 for preventing light reflection and a silicon dioxide film 52 for protecting the barrier and other exposed surfaces from ambient influences on the barrier and the surfaces.

A first electrode 56 was in ohmic contact with the surface of the n$^+$-layer through windows formed in the film 54. A second electrode 51 was in ohmic contact with the n$^+$-layer. In this embodiment, the barrier (J) is located at a position remote from the light-receiving surface on the p$^+$-layer. Accordingly, characteristics of the barrier are not affected even when the first electrode is bonded to the light-receiving surface. In the embodiment shown in FIG. 3, since the n+-layer is very thin, the barrier may be influenced by the bonding of the first electrode 36 onto the surface of the n$^+$-layer. From this point of view, the avalanche photodiode shown in FIG. 4 is easier to manufacture than that shown in FIG. 3. It was found that the avalanche photodiode shown in FIG. 4 had nearly the same breakdown voltage, light-current conversion efficiency, and noise level as the photodiode shown in FIG. 3.

Figure 5:
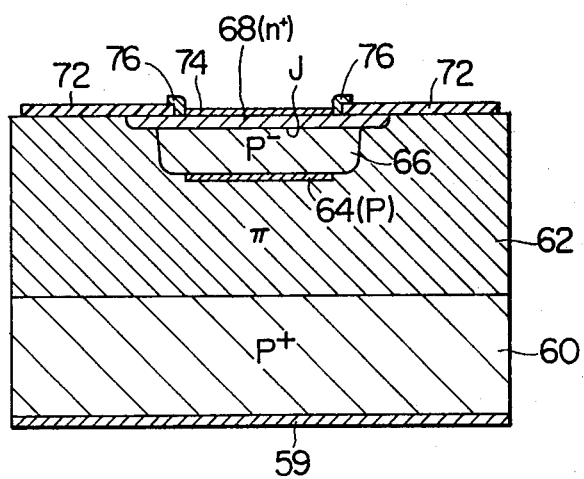
FIG. 5 is a sectional view of an avalanche photodiode according to still another embodiment of the present invention.

FIG. 5 shows still another embodiment of the present invention wherein the edge surface of a rectification barrier (J) is exposed to one surface of a semiconductor body. Therefore, this photodiode may be called a planar type.

On a p$^+$-substrate 60, there is formed a $\pi$-layer 62 having a doping concentration of $1 \times 10^{14}$ cm$^{-3}$ and a thickness of 20.5$\mu$m by the use of an epitaxial growth method. Then, in a central portion of the $\pi$-layer, there is formed by a selective etching method a recess of 7.5$\mu$m depth. From the surface forming the bottom of the recess, a p-layer (an intermediate) 64 was formed by a known ion-implantation method, the p-layer having a thickness of 1$\mu$m and a doping concentration of $1 \times 10^{16}$ cm$^{-3}$. Then, a p$^-$-layer 66 having a doping concentration of $1 \times 10^{15}$ cm$^{-3}$ and a thickness of 7.5$\mu$m is formed by the use of a known selective epitaxial growth method. Into the p$^-$-layer donor impurities are diffused to form an n$^+$-layer 68 having a doping concentration of $1 \times 10^{19}$ cm$^{-3}$ and a thickness of 1$\mu$m, thereby forming a rectification barrier (J). Accordingly, the final thickness of the p$^-$-layer is about 6.5$\mu$m.

Thereafter, an insulating film 72 made of, such as, a silicon dioxide film and a film 74 for preventing light reflection are formed by a chemical vapor deposition. A first electrode 76 in ohmic contact with the surface of the n$^+$-layer is formed through windows formed in the film 74 and the insulating film 72. A second electrode 59 is similarly formed to obtain an ohmic contact with the surface of the p$^+$-substrate.

The extending region of the intermediate layer 64 in the transverse direction in the figure is smaller than those of the p$^-$-layer and n$^+$-layer so that the breakdown voltage at the portion where the intermediate layer 64 exists is considerably smaller than that of the portion where no intermediate layer exists. As a result, the junction (J) surrounding the other part of the junction (J) where avalanche breakdown occurs may form a so-called guard ring so that the photodiode has a stable operation characteristic.

Since the distribution of doping concentrations in the functioning region of the photodiode is almost the same as that of the photodiode shown in FIG. 3, the layers 62, 64 and 66 are depleted when the photodiode is in an operational condition, thereby exhibiting similar operational characteristics to that of the photodiode shown in FIG. 3.

In order to stabilize the operation of avalanche photodiodes shown in FIGS. 3 and 4, it is desirable to form a guard ring (39 in FIG. 3 or 58 in FIG. 4) in a similar manner disclosed in U.S. Pat. No. 3,886,579.

It has also been found by the present inventors that the present invention is applicable to such cases where the doping concentration of the p$^-$-layer increases gradually or stepwise from the part near the barrier junction towards the $\pi$-layer. In this case, the doping concentration and thickness of the p$^-$-layer are determined based on the concept described hereinbefore, taken in conjunction with FIG. 2. The doping concentration of the p$^-$-layer near the barrier junction is controlled to a certain value, which is much smaller than that of the p$^-$-layer near the $\pi$-layer. By employing this modification with regard to the doping concentration, the maximum field intensity (Emax) at the barrier junction becomes smaller than that shown in FIG. 2. At the same time, the field intensity at the interface between the p$^-$-layer and the $\pi$-layer is slightly lowered. However, the operation mode of the device mentioned above is almost the same as that of the device shown in FIG. 3, because the field intensity in the region between the barrier junction and the $\pi$-layer becomes slightly larger than that shown in FIG. 2. In other words, the integral of the field intensity of the modified device is almost the same as that of the device shown in FIG. 3.

There was also prepared a modified device which had the same structure as shown in FIG. 3. However, the p$^-$-layer had a doping concentration of $4 \times 10^{14}$ cm$^{-3}$ at the part near the barrier junction, and the doping concentration thereof was increased gradually towards the $\pi$-layer so that the doping concentration of the p$^-$-layer near the $\pi$-layer was $1 \times 10^{15}$ cm$^{-3}$. This modified device exhibited substantially the same operational characteristics as those of the device shown in FIG. 3. This result may be explained by reference to the basic concept relating to the avalanche phenomenon. In the devices of the present invention, the avalanche region is limited within the p⁻-layer. In the state of avalanche, the integral of the ionization coefficients in the p⁻-layer should be constant in connection with any of the devices mentioned above. Accpordingly, as long as the thickness of the p⁻-layer is the same, the field intensity distribution within the avalanche region is substantially the same as shown in FIG. 2, even when the doping concentration of the p⁻-layer is smaller than that of the part of the p⁻-layer determined based on the concept described hereinbefore.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed is:

1. An avalanche photodiode with a reduced avalanche breakdown voltage comprising:
   (a) a semiconductor body comprising
      a first semiconductor layer of one conductivity type,
      a second semiconductor layer of the opposite conductivity type, adjoining the first layer, forming a rectification barrier with said first layer, said barrier being biased in the reverse direction when a predetermined voltage is applied thereto,
      a third semiconductor layer of the opposite conductivity type, adjoining said second layer, having a higher doping concentration than said second layer,
      a fourth semiconductor layer of the opposite conductivity type, adjoining said third layer, having a lower doping concentration than said second layer, and
      a fifth semiconductor layer of the opposite conductivity type, adjoining said fourth layer, and having a higher doping concentration than said third layer;
   (b) a first electrode in ohmic contact with said first layer;
   (c) a second electrode in ohmic contact with said fifth layer;
   (d) a film, which covers a light-receiving surface defined in the surface of one of said first and fifth layers, for preventing reflection of a light signal applied to said light-receiving surface; and
   (e) a protecting film which covers the end face of said barrier extended to the surface of said semiconductor body for protecting said barrier from ambient influences.

2. An avalanche photodiode as defined in claim 1, wherein said first layer is of n-type conductivity, whereby electrons initiate the avalanche multiplication when said light signal is applied to said light-receiving surface.

3. An avalanche photodiode as defined in claim 1, wherein said second, third, and fourth layers are epitaxially grown layers.

4. An avalanche photodiode as defined in claim 1, wherein said first, second, third, and fourth layers are successively superposed in a portion with a reduced section area in such a manner that each side face of said layers is exposed to the side face of said portion and the electric field intensity at the barrier is attenuated substantially.

5. An avalanche photodiode as defined in claim 1, wherein the distance between said barrier and said third layer is such that the ionization constant with respect to minority carriers in said second layer is one-fifth to one-tenth the maximum ionization constant at the barrier.

6. An avalanche photodiode as defined in claim 1, wherein said semiconductor body has a mesa portion formed on a broader base portion, said first, second, third, and fourth semiconductor layers making up said mesa portion and said fifth semiconductor layer forming said broader base portion.

7. An avalanche photodiode as defined in claim 6, wherein the thickness of said first, second, third, and fourth semiconductor layers is, respectively, 1μm, 6.5μm, 1μm, and 13μm.

8. An avalanche photodiode as defined in claim 7, wherein the doping concentration of said first, second, third, and fourth semiconductor layers is $1 \times 10^{19}\text{cm}^{-3}$, $1 \times 10^{15}\text{cm}^{-3}$, $1 \times 10^{16}\text{cm}^{-3}$, and $1 \times 10^{14}\text{cm}^{-3}$, respectively.

9. An avalanche photodiode as defined in claim 1, wherein said third semiconductor layer has a doping concentration in a range of $10^{16}$ to $10^{19}\text{cm}^{-3}$ and a thickness of from 0.1 to 2μm.

10. An avalanche photodiode as defined in claim 1, wherein said semiconductor body has first and second opposite surfaces, with said fourth and fifth semiconductor layers extending to said first and second opposite surfaces respectively, and wherein said first semiconductor layer is disposed beneath said first surface and defines a PN junction with said fourth semiconductor layer which extends from said rectification barrier and terminates at said first surface.

11. An avalanche photodiode as defined in claim 10, wherein said second semiconductor layer is disposed within said fourth semiconductor layer and terminates at the bottom of said first semiconductor layer.

12. An avalanche photodiode as defined in claim 11, wherein said third semiconductor layer is disposed within said fourth semiconductor layer and terminates at the bottom of said second semiconductor layer.

13. An avalanche photodiode as defined in claim 10, wherein the thicknesses of said first, second, third, and fourth semiconductor layers are, respectively, 1μm, 6.5μm, 1μm and 20.5μm.

14. An avalanche photodiode as defined in claim 13, wherein the doping concentration of said first, second, third, and fourth semiconductor layers is $1 \times 10^{19}\text{cm}^{-3}$, $1 \times 10^{15}\text{cm}^{-3}$, $1 \times 10^{16}\text{cm}^{-3}$, and $1 \times 10^{14}\text{cm}^{-3}$, respectively.

15. An avalanche photodiode as defined in claim 1, wherein the doping concentration of said second semiconductor layer increases from said rectification barrier in a direction away from said rectification barrier.

16. An avalanche photodiode as defined in claim 15, wherein the doping concentration of said second semiconductor layer increases gradually.

17. An avalanche photodiode as defined in claim 15, wherein the doping concentration of said second semiconductor layer increases in a stepwise manner.

18. An avalanche photodiode as defined in claim 15, wherein the doping concentration of said second semiconductor layer is $4 \times 10^{14} cm^{-3}$ adjacent said rectification barrier and $-$to $1 \times 10^{15} cm^{-3}$ adjacent said third semiconductor layer.

19. An avalanche photodiode with a reduced avalanche breakdown voltage, which comprises a semiconductor body having a first main surface at one end thereof and a second main surface at the opposite end thereof, a light-receiving surface being defined in said first main surface to which a light signal is applied;

a first electrode in ohmic contact with said first main surface;

a second electrode in ohmic contact with said second main surface;

a film covering said light-receiving surface for preventing reflection of said light signal; and a protecting film covering an end face of a rectification barrier formed in said semiconductor body; and wherein said semiconductor body comprises a portion composed of:

a first semiconductor layer of one conductivity type;

a second semiconductor layer of the opposite conductivity type, adjoining said first layer to form said rectification barrier with said first layer;

a third semiconductor layer of the opposite conductivity type, adjoining said second layer, having a higher doping concentration than said second layer; and a fourth semiconductor layer of the opposite conductivity type, adjoining said third layer, having a lower doping concentration than said second layer, said portion having a reduced section area, and wherein said body further includes a fifth semiconductor layer of the opposite conductivity type adjoining said fourth layer and having a larger sectional area than said portion, and having a higher doping concentration than said third layer, said fifth layer being exposed at said first main surface.

20. An avalanche photodiode with a reduced avalanche breakdown voltage, which comprises a semiconductor body having a first main surface at one end thereof and a second main surface at the opposite end thereof, a light-receiving surface being defined in said first main surface to which a light signal is applied;

a first electrode in ohmic contact with said first main surface;

a film, covering said light-receiving surface, for preventing reflection of said light signal and a protecting film, covering an end face of a rectification barrier formed in said semiconductor body; and wherein said semiconductor body comprises a portion composed of a first semiconductor layer of one conductivity type, exposed at said first main surface;

a second semiconductor layer of the one conductivity type, adjoining said first layer, having a lower doping concentration than said first layer;

a third semiconductor layer of the one conductivity type, adjoining said second layer, having a higher doping concentration than said second layer; and a fourth semiconductor layer of the one conductivity type, having a higher doping concentration than said second layer, but a lower doping concentration than said third layer, and wherein, said body further includes a fifth semiconductor layer of the opposite conductivity type, adjoining said fourth layer, said rectification barrier formed between said fourth and fifth layers being exposed to said end face, and wherein said portion has a reduced sectional area relative to that of said fifth layer.

21. An avalanche photodiode as defined in claim 20, wherein the thicknesses of said first, second, third, and fourth semiconductor layers are, respectively, $1\mu m$, $13\mu m$, $1\mu m$, and $6.5\mu m$.

* * * * *